(12) United States Patent
Bajan et al.

(10) Patent No.: US 8,917,508 B2
(45) Date of Patent: Dec. 23, 2014

(54) ARRANGEMENT OF A POWER SEMICONDUCTOR CIRCUIT

(75) Inventors: Liviu Bajan, Dettingen (DE); Samir El Gharib, Warstein (DE); Gerrit Schulte, Ruethen (DE)

(73) Assignee: AEG Power Solutions B.V., Zwanenburg (NL)

( * ) Notice: Subject to any disclaimer, the term of this patent is extended or adjusted under 35 U.S.C. 154(b) by 330 days.

(21) Appl. No.: 13/439,558

(22) Filed: Apr. 4, 2012

(65) Prior Publication Data

US 2013/0077244 A1 Mar. 28, 2013

(30) Foreign Application Priority Data

Sep. 23, 2011 (EP) .................................... 11182462

(51) Int. Cl.
*H05K 7/20* (2006.01)
*F28F 7/00* (2006.01)
*H01L 23/467* (2006.01)

(52) U.S. Cl.
CPC .......... *H05K 7/20927* (2013.01); *H01L 23/467* (2013.01)
USPC ......... 361/699; 361/702; 165/80.4; 165/80.5; 165/104.33; 363/141; 257/714

(58) Field of Classification Search
CPC ......... H05K 7/2089–7/20945; H05K 7/20218; H05K 7/20254; H01L 23/473
USPC ....................... 361/679.46–679.54, 688–723; 165/80.4–80.5, 104.33; 363/141; 257/712–722

See application file for complete search history.

(56) References Cited

U.S. PATENT DOCUMENTS

| | | | | |
|---|---|---|---|---|
| 4,079,410 | A * | 3/1978 | Schierz | 257/714 |
| 6,031,751 | A * | 2/2000 | Janko | 363/144 |
| 6,717,115 | B1 * | 4/2004 | Pfahnl et al. | 219/444.1 |
| 6,819,561 | B2 * | 11/2004 | Hartzell et al. | 361/689 |
| 7,417,857 | B2 * | 8/2008 | Rondier et al. | 361/699 |
| 7,755,898 | B2 * | 7/2010 | Aoki et al. | 361/710 |
| 7,876,561 | B2 * | 1/2011 | Schnetzka et al. | 361/699 |
| 7,940,526 | B2 * | 5/2011 | Schulz-Harder et al. | 361/699 |
| 2008/0111151 | A1 | 5/2008 | Teraki et al. | |
| 2008/0186034 | A1 * | 8/2008 | Scheckenbach et al. | 324/679 |
| 2009/0241575 | A1 * | 10/2009 | Jadric et al. | 62/259.1 |
| 2010/0033932 | A1 * | 2/2010 | Thome et al. | 361/699 |
| 2010/0232111 | A1 | 9/2010 | Baker et al. | |
| 2013/0051108 | A1 * | 2/2013 | Nagao et al. | 363/141 |

FOREIGN PATENT DOCUMENTS

| | | |
|---|---|---|
| EP | 1895825 A1 | 3/2008 |
| JP | 2002353405 A | 12/2002 |
| WO | 2009136277 A1 | 11/2009 |

OTHER PUBLICATIONS

European Search Report for corresponding EP Patent Application No. 11182462.9 dated Jan. 27, 2012.

* cited by examiner

*Primary Examiner* — Zachary M Pape
(74) *Attorney, Agent, or Firm* — Cohen & Hildebrand, PLLC

(57) ABSTRACT

The invention relates to a power electronic assembly (1, 2, 3) with a heat sink (2), a power semiconductor module (1) and a circuit arrangement (3) for controlling the power semiconductor module, wherein the heat sink (2) has at least two parallel channels through which a coolant can flow.

17 Claims, 4 Drawing Sheets

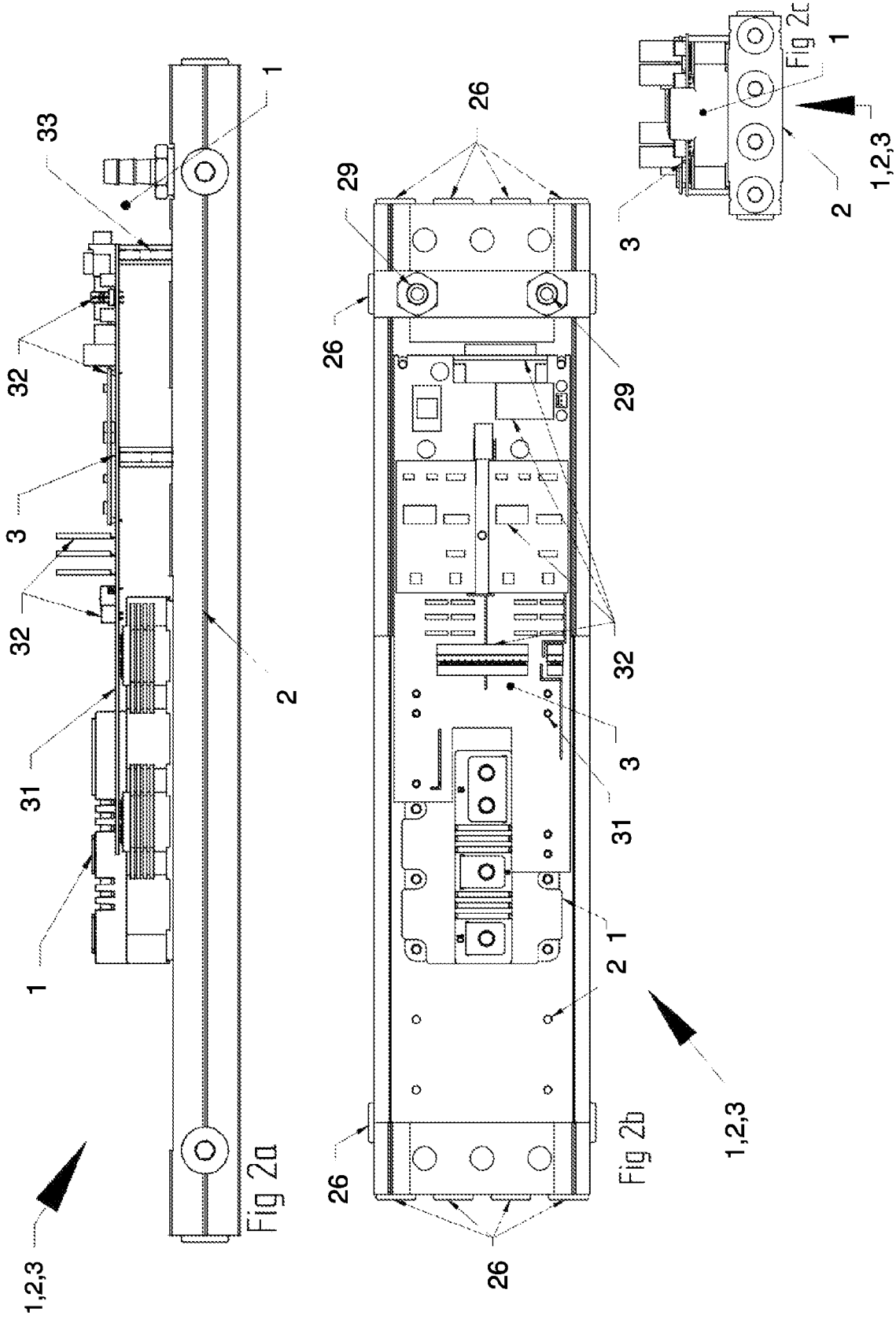

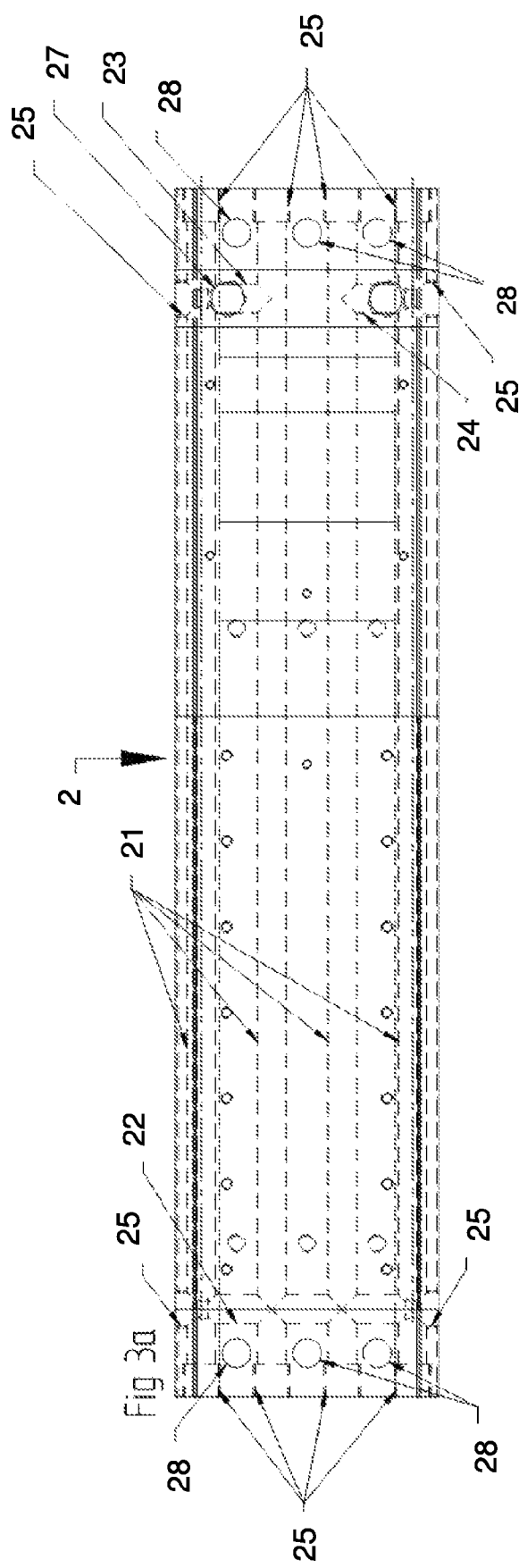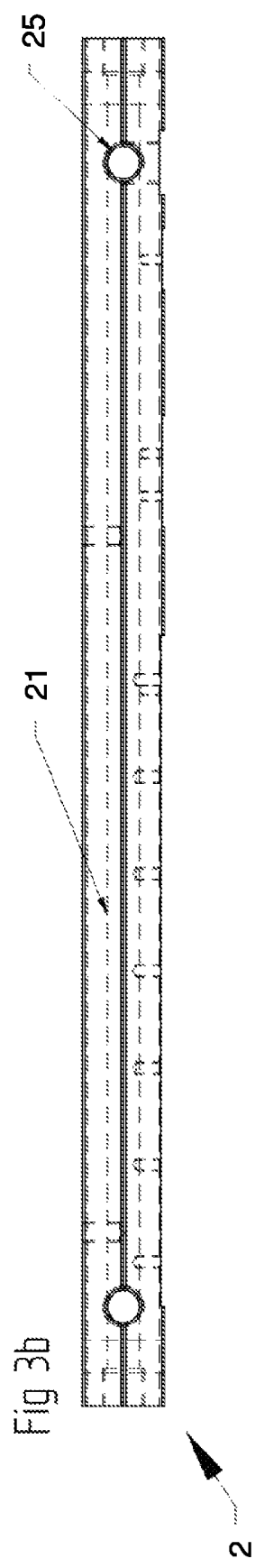

Figure 1:
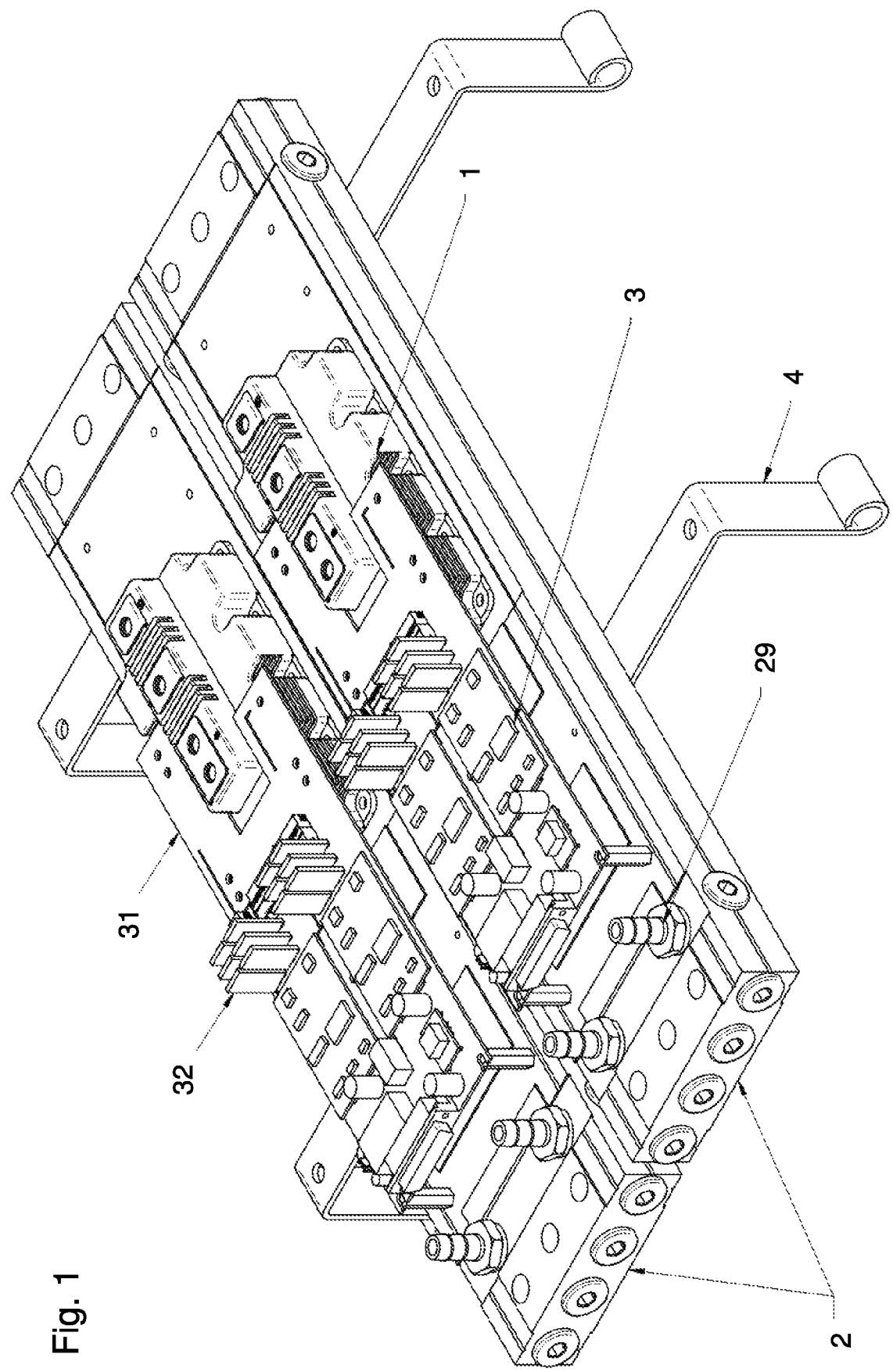

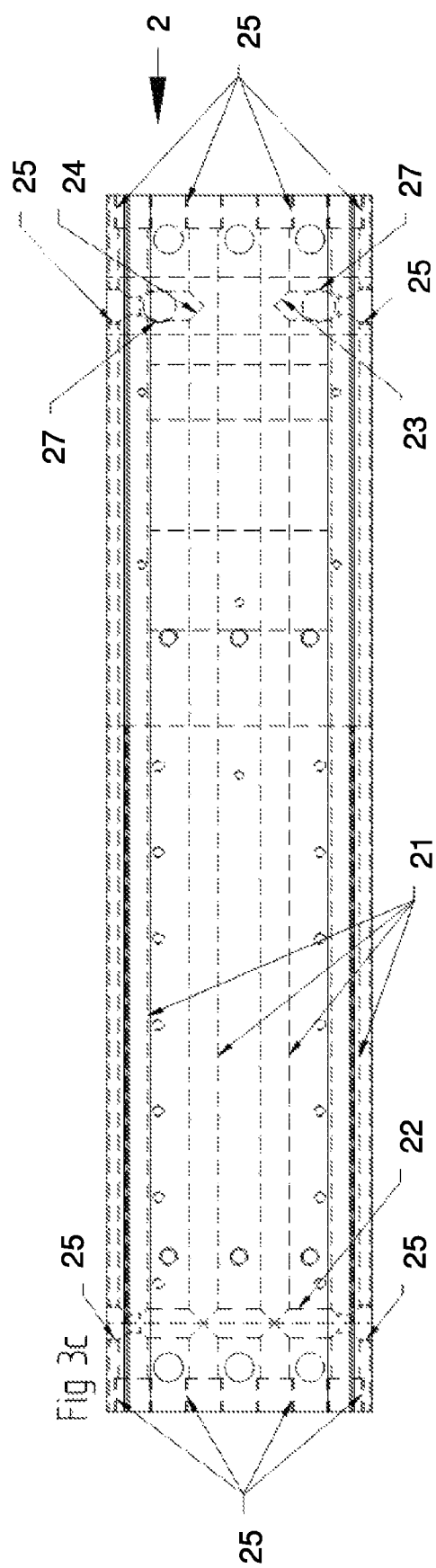
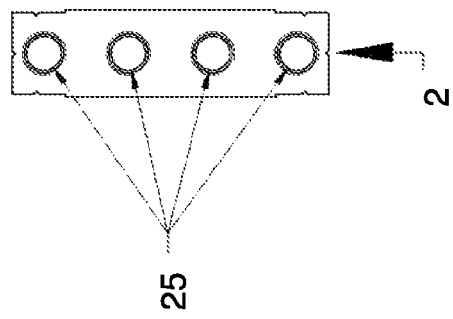
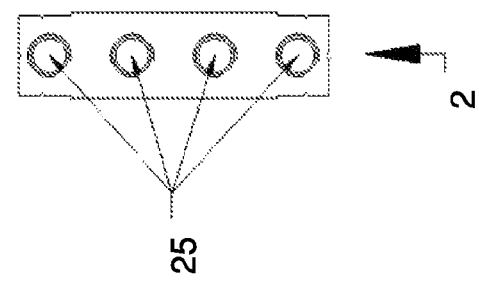

ARRANGEMENT OF A POWER SEMICONDUCTOR CIRCUIT

BACKGROUND OF THE INVENTION (1) Field of the Invention

The present invention relates to a power electronic assembly with a heat sink, a power semiconductor module and a circuit arrangement for controlling the power semiconductor module.

Power semiconductor modules and associated circuit arrangements for controlling the power semiconductor modules are currently widely used. They frequently form parts of power supplies, converters, in particular inverters or rectifiers, or other electrical arrangements.

(2) Description of Related Art

It is presently customary to construct so-called stacks (for example, Prime Stacks from in Infinion AG) for each application or for a group of applications. These stacks have a heat sink on which a plurality of power semiconductor modules and the circuit arrangements associated with these powers semiconductor modules for controlling the modules are arranged.

When planning all applications of power electronics, the developer must pay particular attention to the cooling of the power electronic components. Depending on the thermal load, a coolant in liquid or gaseous form may have to be supplied to adequately dissipate heat. The power electronics in conventional applications is cooled individually. This increases the individuality of the assemblies.

The high degree of individuality and particularly the associated development complexity have associated costs which make the finished product more expensive.

This is a starting point for the present invention.

It is the object of the invention to propose a power electronic assembly which offers many possible different applications through different possibilities for adequate cooling.

BRIEF SUMMARY OF THE INVENTION

This object is solved with the invention by employing a heat sink with at least two parallel channels through which a coolant flows.

The assembly according to the invention can be used in many different ways. Initially, at low thermal load, the assembly can be used entirely without a coolant flowing through the channels. The heat capacity and the heat transport through radiation and convection are sufficient for dissipating the generated heat. At greater thermal loads, heat can be dissipated with a coolant flowing at least through a portion of the channels. The medium may be a gas, for example air, or a fluid, for example water or oil. In particular at high thermal loads, a fluid flows preferably through at least a portion of the channels.

The cooling power can be adapted to different applications by using a heat sink.

The parallel design of the channels facilitates the manufacture of the heat sinks, which are typically produced from an extruded profile or machined, for example drilling or milling, from an aluminum block.

The channels may also be connected with one another by at least one first connecting channel. The channels can be connected inside the heat sink by way of these connecting channels. The connecting channels can be produced by drilling or other suitable machining. The channels can be connected in parallel or in series for fluid conduction. The series connection can be implemented inside the heat sink or by lines arranged outside the heat sink and connecting the channels.

In the heat sink of a power electronic assembly according to the invention, a first plurality of first adjacent channels of the channels may form supply channels having end regions which are connected with one another via the first connecting channel. A second plurality of second adjacent channels of the channels may form return channels having start regions which are connected with one another via the first connecting channel and which are connected with the end regions of the supply channels. With this connection, the supply channels and the return channels may be connected in series by way of the connecting channel for fluid conduction. The first plurality and the second plurality may have identical size.

Start regions of the supply channels may be connected via a second connecting channel and end regions of the return channels may be connected via third connecting channels.

Preferably, fittings for connecting the channels to supply lines or return lines may be provided in the start region of the supply channels and in the end region of the return channels.

The channels and/or the connecting channels in the heat sink of a power electronic assembly according to the invention may be implemented as sections of through-holes and/or blind holes in a block which forms the heat sink. The sections of the through-holes and/or blind holes may be delimited by stoppers, screws and the like. The through-holes and/or the blind holes may be subdivided by the stoppers, screws or the like into sections forming one or several channels. The block with the through-holes and/or the blind holes can thereby be adapted to the individual requirements of a power electronic assembly to be produced with the block forming the heat sink, without requiring an entirely new design of a heat sink.

The stoppers, screws or the like can be glued or releasably inserted into the block.

The channels in the heat sink can be configured by placing or removing stoppers, screws or the like. In this way, several channel systems can be configured for adapting the heat sink to different thermal loads.

Like stoppers, screws or the like, fittings can be releasably inserted into the block to provide inlets or outlets for the coolant at different locations.

Preferably, the stoppers and the fittings can be selectively inserted into the end of one of the holes (through-holes or blind holds).

The power semiconductor module is preferably mounted on the heat sink to ensure good thermal transport from the power semiconductor module to the heat sink.

The circuit arrangement for controlling the power semiconductor module may be arranged on a circuit carrier which may be attached on the heat sink with spacers in spaced relationship from the surface of the heat sink. The circuit board may have an opening into which the power semiconductor module penetrates or through which the power semiconductor module extends.

The heat sink of a power electronic assembly according to the invention may have on a side facing away from the power semiconductor module at least one groove, at least one bore, in particular with an internal thread, at least one screw channel and the like, in which fasting means for mounting the power electronic assembly to a carrier are provided.

Advantageously, the power electronic assembly according to the invention has exactly one power semiconductor module and exactly one circuit arrangement for controlling just this module. Typically, such power electronic assembly according to the invention is unable to realize a complete power-electronics arrangement, for example a converter. Several, at least two power electronic assemblies according to the invention are therefore used for an arrangement according to the invention.

A power electronic assembly according to the invention may also have two different power semiconductor modules on one heat sink, wherein the power semiconductor modules are preferably used in different converters. This is of particular interest for arrangement where two converters, namely an input-side and an output-side converter are implemented, for example in a frequency converter which includes a rectifier, a DC link circuit and an inverter. Because the power electronic assembly then advantageously includes only one power semiconductor module of the input side converter and one power semiconductor module of the output side converter, the arrangement according to the invention must therefore also have several power semiconductor modules. The heat sink for attachment of two power semiconductor modules may then need to be constructed in a particular manner, for example with planar surfaces arranged on both sides of the heat sink. These may be produced by further machining a heat sink or may already be initially provided.

The power electronic assembly can be arranged with respect to one another so that the channels are parallel to one another.

The arrangement may have inlets and outlets for a coolant which are connected to the supply channels and return channels, respectively, with fittings arranged in the start regions of the supply channels and in the end regions of the return channels.

The power electronic assemblies may be connected in parallel for fluid conduction.

The power electronic assemblies of an arrangement according to the invention may be identical.

The power electronic assemblies may be mounted on at least one carrier, for example a mounting rail.

An exemplary embodiment of a power electronic assembly according to the invention and an arrangement which includes two of these assemblies will be described in more detail with reference to the drawings. It is shown in

BRIEF DESCRIPTION OF THE SEVERAL VIEWS OF THE DRAWING(S)

FIG. 1 a perspective view of the arrangement according to the invention,

FIGS. 2a to 2c the power electronic assembly in different views, and

FIGS. 3a to 3e a heat sink of the power electronic assembly according to FIGS. 2a to 2c in different views.

DETAILED DESCRIPTION OF THE INVENTION

The arrangement according to the invention may be part of, for example, a frequency converter. A typical frequency converter includes an input rectifier, a DC link circuit and an output inverter. The exemplary arrangement according to the invention illustrated in FIG. 1 forms the output inverter A of a frequency converter. However, arrangements according to the invention may also form other circuits.

The output inverter A generates a single-phase AC current from the DC current of the DC link circuit. For generating the AC current, the output inverter includes bipolar transistors with insulated gate electrodes (IGBTs), which are connected in form of an H-circuit. This conventional circuit for generating single-phase AC current requires four IGBTs. Two IGBTs are each housed in a power semiconductor module 1. Such power semiconductor modules 1 are offered by several manufacturers.

The power semiconductor modules 1 are combined with a circuit arrangement 3 for controlling the power semiconductor modules 1, which includes a circuit carrier 31 and components 32 arranged thereon, and with a heat sink 2 to form a power electronic assembly 1, 2, 3 (see FIGS. 2a to 2b). The arrangement A according to the invention has two such power electronic assemblies 1, 2, 3 which are mounted on two mounting rails 4.

Power electronic assemblies according to the invention may also include power semiconductor modules other than IGBT power semiconductor modules. An arrangement according to the invention may also include more than two power electronic assemblies.

Different circuits may be realized with power electronic assemblies 1, 2, 3 according to the invention. For example, the IGBTs of the IGBT power semiconductor modules in the aforementioned H-circuit may also be connected in a different bridge circuit or in any type of midpoint connection. The IGBT power electronic modules themselves need not be altered at all or need only be altered slightly. Simple changes may be performed by suitable programming. Optionally, a component in the control circuit arrangement 3 may have to be changed. In the most complex case, the entire control circuit arrangement 3 may have to be exchanged. The heat sink 2 may only have to be changed in response to a change in the thermal load, for example because additional power semiconductor modules are to be mounted. However, the heat sink can be easily changed, as will be described below.

In particular, these simple changes of an arrangement according to the invention, particularly also a simple scalability of an arrangement according to the invention, becomes possible due to the association of the heat sink 2 with a power semiconductor module.

The power semiconductor module 1 is preferably mounted directly on the heat sink 2, allowing an efficient heat transfer from the thermally heavily loaded power semiconductor module 1 to the heat sink.

The circuit arrangement 3 is preferably mounted on the heat sink with spacers 33, wherein the circuit carrier 31 of the circuit arrangement 3 may have an opening through which parts of the power semiconductor module 1 protrude.

The heat sink 2 is designed for easy adaptation to different thermal loads.

The cooling body is produced from an extruded aluminum profile. The extruded profile is hereby produced with four parallel first holes extending in the longitudinal direction, namely through-holes 21. In an end region of these through-holes 21 and transverse to the first through-holes 21, the extruded profile includes a second hole, namely a through-hole 22, which intersects with the first through-holes 21. A third hole, namely a blind hole 23, and a fourth hole, namely a blind hole 24, which each intersect two of the first through-holes 21, are introduced from two different sides in an end region located opposite the second through-hole 22.

Threads 25 are cut at the ends of the through-holes 21, 22 and at the ends of the blind holes 23, 24, into which stoppers 26 which close the holes 21, 22, 23, 24 are screwed and/or glued.

Additional blind holes are introduced from a top side of the heat sink, which open into the third hole 23 and the fourth hole 24. Fittings 29 are inserted in these additional blind holes. These fittings 29 form an inlet and an outlet for the channel system formed in the cuboid by the holes 21, 22, 23, 24 from channels (formed by the sections of the first holes 21), a first connecting channel (formed by a section of the second hole 22), a third connecting channel (formed by a section of the third hole 23) and a fourth connecting channel (is formed by a section of the fourth hole 24). The sections of the holes forming channels or connecting channels are delimited by the material of the cuboid and the stoppers 26.

Two of the channels form supply channels which start at one of the two fittings 29 which forms an inlet and terminate at the first connecting channel formed by a section of the second hole 22. The two other channels form return channels which start at the first connecting channel and terminate at one of the other two fittings 22. These fittings then form an outlet. A coolant can thus flow from the inlet to the outlet through the heat sink.

In an alternative embodiment, the stoppers 26 which close the first holes 21 and are screwed into the end faces of the cuboid, may be removed and replaced by fittings. If the existing fittings 29 are replaced by stoppers, the coolant can then flow from one end face to the other end face of the heat sink and dissipate a larger amount of heat from the heat sink. The heat sink can thereby be adapted to the expected thermal load by using simple measures.

The invention claimed is:

1. A power electronic assembly comprising:
   a heat sink as a cooling body (2),
   a power semiconductor module (1), and
   a circuit arrangement (3) for controlling the power semiconductor module,
   wherein the cooling body (2) comprises at least two parallel channels for accommodating flowing coolant,
   wherein the channels are connected with one another by at least one first connecting channel,
   wherein a first plurality of first adjacent channels of the channels form supply channels having end regions connected with one another by way of the first connecting channel, and a second plurality of second adjacent channels of the channels form return channels having start regions which are connected with one another via the first connecting channel and which are connected with the end regions of the supply channels,
   wherein start regions of the supply channels are located on a first side of the cooling body, and the at least one first connecting channel is located on a second, opposite side of the cooling body.

2. The power electronic assembly according to claim 1, wherein the first plurality and the second plurality are identical.

3. The power electronic assembly according to claim 1, wherein start regions of the supply channels are connected by way of a second connecting channel.

4. The power electronic assembly according to claim 1, wherein the end regions of the return channels are connected by way of a third connecting channel.

5. The power electronic assembly according to claim 1, wherein the channels and/or the at least one connecting channel is formed by sections of through-holes (21, 22) and/or blind holes (23, 24) in a solid body forming the cooling body (2).

6. The power electronic assembly according to claim 5, wherein the sections of the through-holes (21, 22) and/or blind holes (23, 24) are delimited by stoppers (26) or screws and by the solid body.

7. The power electronic assembly according to claim 6, wherein the stoppers (26) or the screws are glued or releasably inserted into the solid body.

8. The Power electronic assembly according to claim 5, wherein the solid body forming the cooling body (2) is a block or an extruded profile.

9. The power electronic assembly according to claim 1, wherein the power semiconductor module (1) is mounted on the heat sink (2).

10. The power electronic assembly according to claim 1, wherein the circuit arrangement (3) for controlling the power semiconductor module (1) comprises a circuit carrier (31) which is mounted on the heat sink (2) with spacers (33) such that the circuit carrier is in spaced relationship from a surface of the heat sink (2).

11. The power electronic assembly according to claim 1, wherein the heat sink (2) comprises, on a side facing away from the power semiconductor module (1), bores (28) or at least one groove via which the power electronic, assembly (1, 2, 3) is mounted on a carrier.

12. An arrangement (A) comprising several power electronic assemblies, each power electronic assembly comprising:
   a heat sink as a cooling body (2),
   a power semiconductor module (1) and
   a circuit arrangement (3) for controlling, the power semiconductor module,
   wherein the cooling body (2) comprises at least two parallel channels for accommodating flowing coolant,
   wherein the channels are connected with one another by at least one first connecting channel,
   wherein a first plurality of first adjacent channels of the channels torn supply channels having end regions connected with one another by way of the first connecting channel, and a second plurality of second adjacent channels of the channels form return channels having start regions which are connected with one another via the first connecting channel and which are connected with the end regions of the supply channels,
   wherein start regions of the supply channels are located on a first side of the cooling body, and the at least one first connecting channel is located on a second, opposite side of the cooling body.

13. The arrangement (A) according to claim 12, wherein the arrangement (A) comprises, in part, an inverter.

14. The arrangement (A) according to claim 12, wherein the arrangement (A) comprises supply lines and return lines for a coolant which are connected to the supply channels and the return channels, respectively, with fittings provided in start regions of the supply channels and in end regions of the return channels, respectively.

15. The arrangement (A) according to claim 12, wherein the arrangement (A) comprises, in part, a clocked rectifier.

16. An arrangement (A) comprising several power electronic assemblies, each power electronic assembly comprising:
   a heat sink as a cooling body (2),
   a power semiconductor module (1) and
   a circuit arrangement (3) for controlling the power semiconductor module,
   wherein the cooling body (2) comprises at least two parallel channels for accommodating flowing coolant,
   wherein the channels are connected with one another by at least one first connecting channel,
   wherein a first plurality of first adjacent channels of the channels form supply channels having end regions connected with one another by way of the first connecting channel, and a second plurality of second adjacent channels of the channels form return channels having start regions which are connected with one another via the first connecting channel and which are connected with the end regions of the supply channels, wherein the power electronic assemblies are arranged with respect to one another such that the channels are arranged parallel to one another.

17. An arrangement (A) comprising several power electronic assemblies, each power electronic assembly comprising:

a heat sink as a cooling body (2), a power semiconductor module (1) and a circuit arrangement (3) for controlling the power semiconductor module, wherein the cooling body (2) comprises at least two parallel channels for accommodating flowing coolant, wherein the channels are connected with one another by at least one first connecting channel, wherein a first plurality of first adjacent channels of the channels form supply channels having end regions connected with one another by way of the first connecting channel, and a second plurality of second adjacent channels of the channels form return channels having start regions which are connected with one another via the first connecting channel and which are connected with the end regions of the supply channels, wherein the arrangement (A) comprises supply lines and return lines for a coolant which are connected to the supply channels and the return channels, respectively, with fittings provided in start regions of the supply channels and in end regions of the return channels, respectively, wherein the power electronic assemblies are connected in parallel.

* * * * *